United States Patent
Restrepo et al.

(10) Patent No.: US 9,332,664 B2
(45) Date of Patent: May 3, 2016

(54) WIRING DEVICE WITH INTEGRATED DIRECT CURRENT OUTPUT

(71) Applicants: Carlos Eduardo Restrepo, Atlanta, GA (US); Oscar Lewis Neundorfer, Senoia, GA (US); Rohit Sumerchand Dodal, Peachtree City, GA (US)

(72) Inventors: Carlos Eduardo Restrepo, Atlanta, GA (US); Oscar Lewis Neundorfer, Senoia, GA (US); Rohit Sumerchand Dodal, Peachtree City, GA (US)

(73) Assignee: Cooper Technologies Company, Houston, TX (US)

( * ) Notice: Subject to any disclaimer, the term of this patent is extended or adjusted under 35 U.S.C. 154(b) by 239 days.

(21) Appl. No.: 13/919,633

(22) Filed: Jun. 17, 2013

(65) Prior Publication Data
US 2014/0177169 A1 Jun. 26, 2014

Related U.S. Application Data

(60) Provisional application No. 61/745,015, filed on Dec. 21, 2012.

(51) Int. Cl.
| | | |
|---|---|---|
| H02B 1/36 | (2006.01) | |
| H05K 7/20 | (2006.01) | |
| H05K 1/11 | (2006.01) | |
| H05K 1/14 | (2006.01) | |
| H02J 1/00 | (2006.01) | |
| H01H 9/02 | (2006.01) | |
| H05K 5/02 | (2006.01) | |
| H01R 13/66 | (2006.01) | |
| H01R 103/00 | (2006.01) | |
| H01R 24/78 | (2011.01) | |
| H01R 27/02 | (2006.01) | |
| H01R 107/00 | (2006.01) | |

(52) U.S. Cl.
CPC .......... *H05K 5/0247* (2013.01); *H01R 13/6633* (2013.01); *H01R 24/78* (2013.01); *H01R 27/02* (2013.01); *H01R 2103/00* (2013.01); *H01R 2107/00* (2013.01)

(58) Field of Classification Search
CPC ....... H05K 5/02; H05K 13/00; H05K 5/0247; H01R 4/66; H01R 13/60; H01R 13/6633; H01R 27/02; H01R 2107/00; G06F 1/16; H02M 7/02; H02J 3/34
USPC .......... 361/692, 622, 686, 752, 784; 439/107, 439/620.15, 535, 536; 174/48, 66, 67, 50, 174/53, 58; 307/11; 363/146
See application file for complete search history.

(56) References Cited

U.S. PATENT DOCUMENTS

| | | | |
|---|---|---|---|
| 7,887,363 B1* | 2/2011 | Weeks et al. | 439/535 |
| 2002/0067593 A1* | 6/2002 | Milan | 361/686 |
| 2005/0068792 A1* | 3/2005 | Yasumura | 363/21.06 |
| 2007/0149061 A1* | 6/2007 | Oddsen et al. | 439/651 |
| 2010/0328849 A1* | 12/2010 | Ewing et al. | 361/622 |

(Continued)

*Primary Examiner* — Courtney Smith
*Assistant Examiner* — Zhengfu Feng
(74) *Attorney, Agent, or Firm* — King & Spalding LLP

(57) ABSTRACT

The present disclosure provides a wiring device with integrated DC output interfaces alongside AC output interfaces. The wiring device converts AC power received from the grid into DC power that can be used directly by DC loads. In certain example embodiments, the wiring device includes USB receptacles as the DC output interfaces. The wiring device also includes various power management enhancement features. Some such features include crimping and soldering electrical wires directly to the AC output contacts and a midframe for insulating certain components inside the wiring device from heat generated by other components.

20 Claims, 10 Drawing Sheets

(56) References Cited

U.S. PATENT DOCUMENTS

2011/0261545 A1* 10/2011 Chen et al. .................. 361/784
2012/0170342 A1* 7/2012 Manning ...................... 363/146
2012/0292991 A1* 11/2012 Dodal et al. ................... 307/11

* cited by examiner

WIRING DEVICE WITH INTEGRATED DIRECT CURRENT OUTPUT

CROSS-REFERENCE TO RELATED APPLICATIONS

The present application claims priority to U.S. Provisional Patent Application No. 61/745,015 titled "Wiring Device With Integrated Direct Current Output" and filed Dec. 21, 2012, the entire contents of which are incorporated herein by reference.

TECHNICAL FIELD

The present disclosure relates generally to electrical wiring devices and more particularly, to wiring devices with integrated direct current ("DC") output.

BACKGROUND

A proliferation of portable battery operated electronic devices, e.g., cell phones, personal digital assistants ("PDAs"), electronic book readers, portable games players, MP3 music players, digital cameras, etc., have created a need for external power sources to recharge the batteries thereof. Heretofore, specific use battery chargers that plug into a standard alternating current ("AC") power wall-mount outlet have been supplied with their respective battery operated electronic device. These battery chargers have been either a step-down transformer with or without AC to direct current ("DC") rectification, or an electronic step-down voltage switch mode power supply ("SMPS").

As technology has advanced, more and more devices have been configured to connect with a Universal Serial Bus ("USB") interface that is capable of supplying both data and power to the portable device. Use of a USB interface eliminates the requirement for separate power and data connectors in the portable device. Problems exist however when a USB battery charger has been misplaced, more than one portable device requires charging, and/or a personal computer is not available as a USB charger. Also some inexpensive USB battery chargers are not energy efficient, e.g., poor power and heat management.

SUMMARY

An example embodiment of the present disclosure includes a wiring device with DC output. The wiring device includes a housing including an AC opening and a DC opening, and an AC power output interface disposed within the housing and aligned with the AC opening, wherein the AC power output interface is electrically coupled to a wire receiver, wherein the wire receiver is configured to receive and electrically couple with an electrical wire, and wherein the electrical wire provides AC power to the AC power output interface. The wiring device further includes a first printed circuit board (PCB) disposed within the housing and configured to electrically couple to the electrical wire, receive the AC power from the electrical wire, and convert the AC power into DC power. The wiring device further includes a DC power output interface disposed within the housing and aligned with the DC opening, wherein the DC power output interface is electrically coupled to the first PCB and receives the DC power from the first PCB.

Another example embodiment of the present disclosure includes a wiring device with AC and DC output. The wiring device includes a housing having an AC opening and a DC opening, and an AC power output interface disposed within the housing and aligned with the AC opening, in which the AC power output interface includes a wire receiving end, the wire receiving end configured to electrically couple with an electrical wire, and in which the electrical wire is configured to provide AC power to the AC power output interface. The wiring device further includes a first printed circuit board (PCB) configured to be electrically coupled to the electrical wire, receive the AC power, and convert the AC power into a DC power, a second PCB electrically coupled to and receiving DC power from the first PCB, and a DC power output interface disposed on the second PCB and aligned with the DC opening, wherein the DC power output interface receives DC power from the second PCB.

Another example embodiment of the present disclosure includes a wiring device with AC and DC output. The wiring device includes a housing comprising an AC opening and a DC opening, and an AC power output interface disposed within the housing and aligned with the AC opening, wherein the AC power output interface comprises a wire receiving portion, wherein the wire receiving portion is crimped, soldered, or crimped and soldered onto a conductor, wherein the conductor is configured to provide AC power to the AC power output interface. The wiring device further includes a first PCB electrically coupled to the conductor and configured to receive the AC power from the conductor, and convert the AC power into a DC power, a second PCB electrically coupled to, and configure to receive the DC power from, the first PCB, and a DC power output interface disposed on the second PCB and aligned with the DC opening, wherein the DC power output interface receives the DC power from the second PCB.

BRIEF DESCRIPTION OF THE DRAWINGS

The foregoing and other features and aspects of the disclosure are best understood with reference to the following description of certain example embodiments, when read in conjunction with the accompanying drawings, wherein.

BRIEF DESCRIPTION OF EXAMPLE EMBODIMENTS

Figure 1:
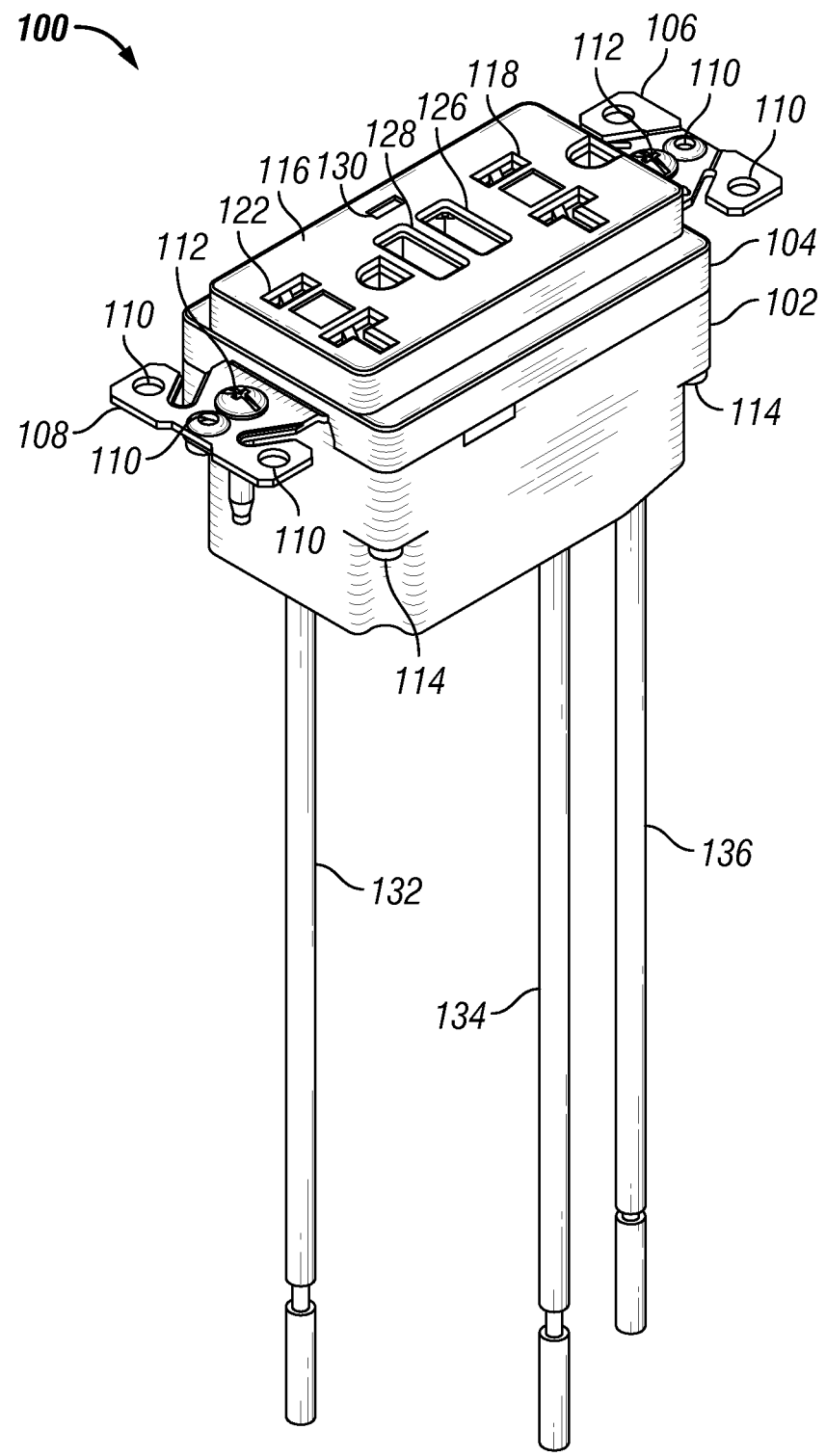
FIG. 1 is a front perspective view of a wiring device with integrated DC output, in accordance with an example embodiment of the present disclosure.

The present disclosure is directed to wiring devices having integrated DC outputs in addition to AC outputs. Although the description of example embodiments is provided below in conjunction with a universal serial bus ("USB") style DC output interface, alternate example embodiments of the disclosure are applicable to other types of DC output interfaces including, but not limited to, coaxial plugs, multi-pin connectors, and any other type of DC output interface known to people having ordinary skill in the art. The example embodiments of the disclosure are better understood by reading the following description of non-limiting, example embodiments with reference to the attached drawings, wherein like parts of each of the figures are identified by like reference characters, and which are briefly described as follows.

The present disclosure provides a wiring device having integrated DC outputs in addition to AC outputs. Thus, in addition to providing AC power, the wiring device also provides DC power directly. Specifically, the wiring device converts the AC power received from building wires into DC power suitable for use with the included DC interface, such as a USB receptacle. In receiving and outputting AC power from building wires and converting such AC power to a lower voltage DC power, a large amount of heat is generated in the wiring device. As such, the wiring device includes certain structural and electrical features that enhance power and heat management of the wiring device. In certain example embodiments, the AC output has a 120V-125V, 15 A-20 A power rating and the DC output has a 5V, 1.8 A power rating. However, these ratings are different in other example embodiments.

FIG. 1 is a front perspective view of a wiring device 100 with integrated DC output, in accordance with an example embodiment of the present disclosure. Referring to FIG. 1, the external components of the wiring device 100 with integrated DC output includes a main housing 102, a top housing 104, an upper coupling band 106, and a lower coupling band 108. A hot wire 132, a neutral wire 134, and a ground wire 136 are coupled to respective contacts of the wiring device 100.

The main housing 102 is substantially a rectangular shell, and generally houses one or more internal components such as PCB's, electronic components, wires, contacts, etc. The main housing 102 is coupled to the top housing 104 to form the external structure of the wiring device 100. In certain example embodiments, the main housing 102 is coupled to the top housing 104 by one or more screws 114 threaded into respective corners of the main housing 102 and top housing 104, joining the top housing 104 and the main housing 102.

The top housing 104 is substantially rectangular shaped, having dimensions corresponding to the dimensions of the main housing 102. The top housing 104 includes a raised face 116. The face 116 faces away from the main housing 102 and remains exposed and accessible to a user when the wiring device 100 is installed in a wall box (not shown). The face 116 includes a plurality of openings 118, 122, 126, 128 for guiding electric plugs of associated loads (not shown) to electric terminals inside the wiring device 100. Specifically, in certain example embodiments, as shown in FIG. 1, the wiring device 100 includes a first AC receptacle 118 and a second AC receptacle 122. The AC receptacles 118, 122 allow plugs of AC loads to be electrically coupled to the wiring device 100 such that AC power is provided from building wires (not shown) to the AC loads. The wiring device 100 further includes a first DC receptacle 126 and a second DC receptacle 128. In certain example embodiments, as shown in FIG. 1, the DC receptacles 126, 128 are universal serial bus ("USB") receptacles capable of receiving and coupling to a USB plug (not shown). In other example embodiments, the DC receptacles 126, 128 are configured to receive DC plugs of other styles and configurations. In certain example embodiments, the wiring device 100 includes an indicator light 130 which lights up when a DC plug is inserted into at least one of the DC receptacles 126, 128 and is electrically coupled to the circuit. In certain example embodiments, the main housing 102 and top housing 104 are fabricated from a material such as a plastic or polycarbonate material having suitable temperature ratings. However, one or more of the housings 102, 104 is fabricated from a different suitable material that is known to people having ordinary skill in the art.

Figure 3:
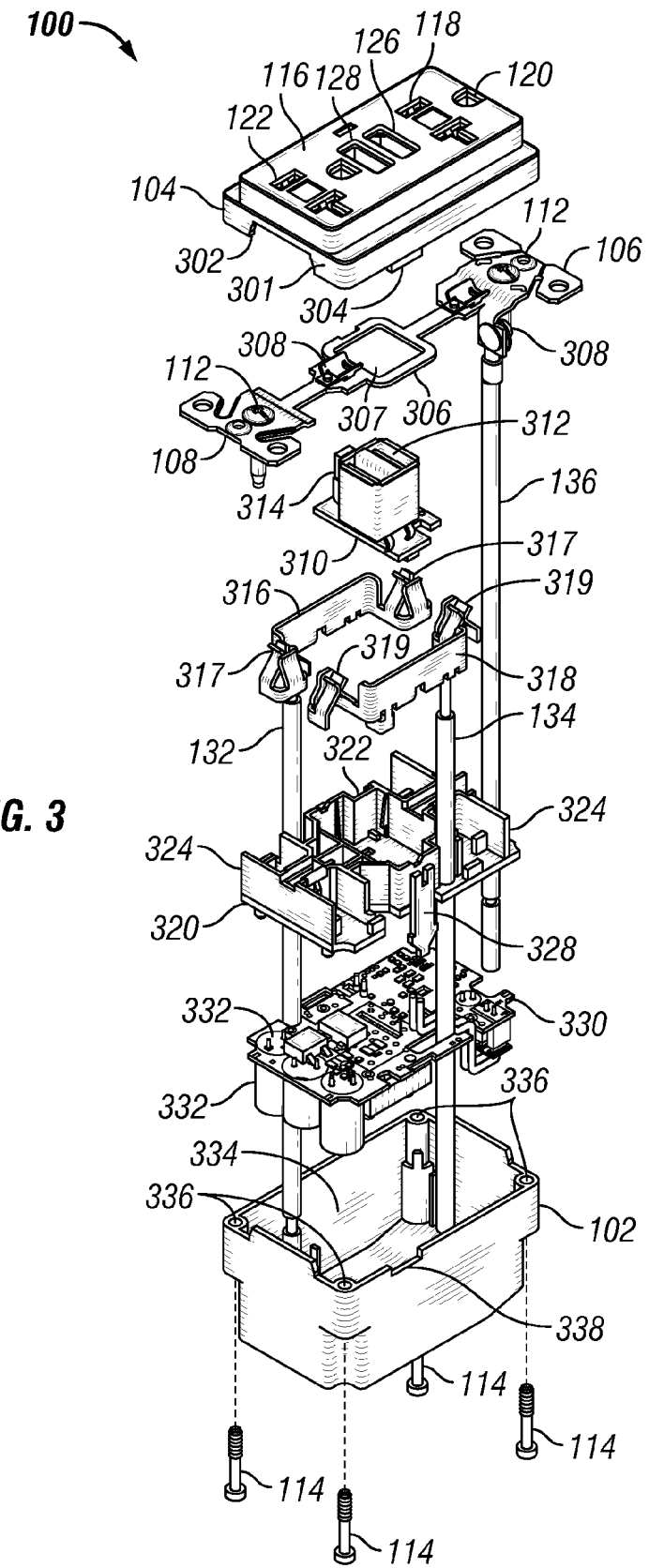
FIG. 3 is an exploded view of the wiring device with integrated DC output of FIG. 1, in accordance with an example embodiment of the present disclosure.

The upper coupling band 106 and the lower coupling band 108 are formed as a single component and coupled to each other by a middle portion 306 (FIG. 3). However, in some example embodiments, the upper coupling band 106 and the lower coupling band 108 are formed separately from one another. The upper and lower coupling bands 106, 108 are both partially disposed between the main housing 102 and the top housing 104. The upper coupling band 106 and the lower coupling band 108 extend lengthwise of the main housing 102 and top housing 104 and respectively extend beyond the length of the main housing 102 and top housing 104 in both directions. The upper and lower coupling bands 106, 108 each include one or more apertures 110. These apertures 110 are used to couple the wiring device 100 to a wall box (not shown) using screws 112 or other fastening device known to people having ordinary skill in the art. The upper coupling band 106 and the lower coupling band 108 are fabricated using a metal, such as steel, but are fabricated using other suitable materials known to people having ordinary skill in the art in other example embodiments.

Figure 2:
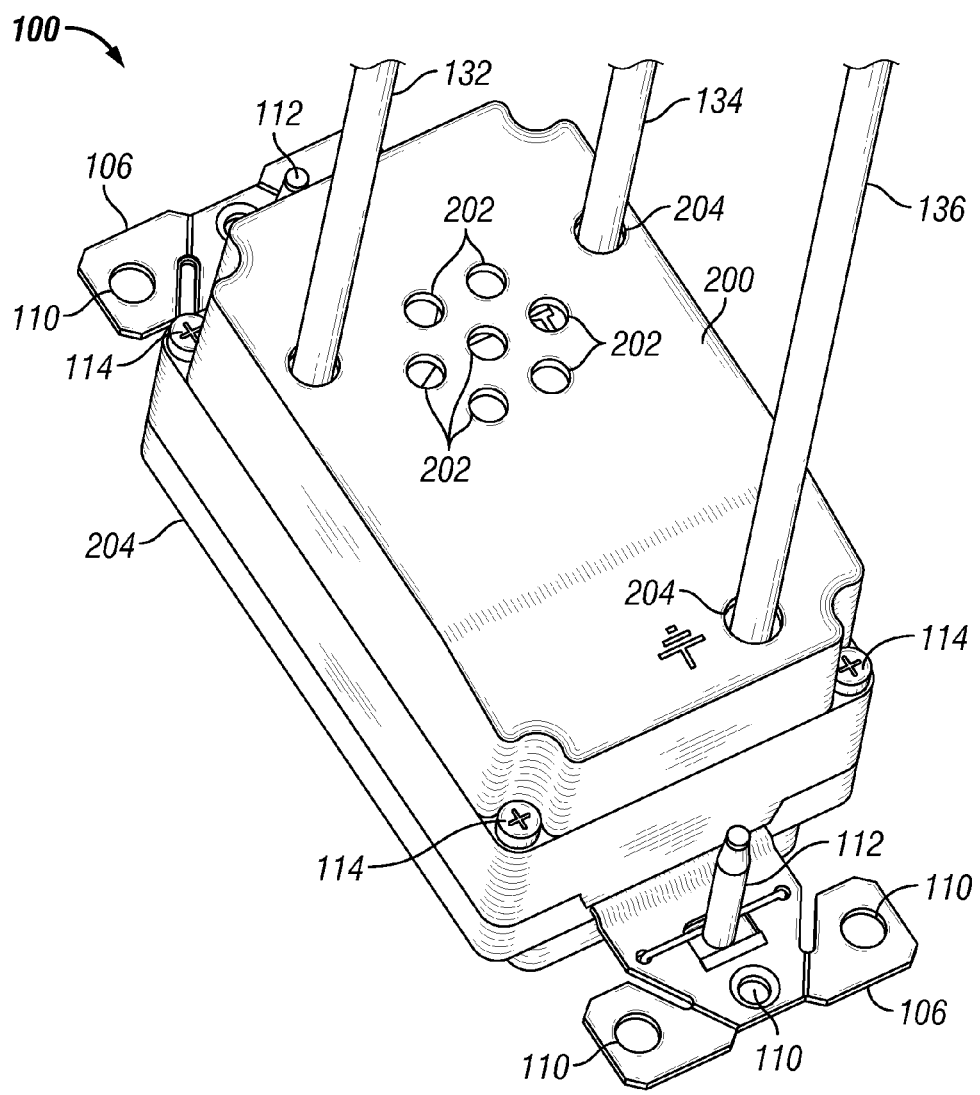
FIG. 2 is a rear perspective view of the wiring device with integrated DC output of FIG. 1, in accordance with an example embodiment of the present disclosure.

FIG. 2 is a rear perspective view of the wiring device 100. Referring to FIG. 2, the main housing 102 includes a back side 200. The back side 200 includes one or more openings 202 which function as vents that allow heat generated by electrical components inside the wiring device 100 to be dissipated outside of the wiring device 100. In certain example embodiments, the openings 202 include a plurality of holes, allowing air to flow between the inside of the wiring device 100 and the environment outside of the wiring device 100. In certain example embodiments, the back side 200 of the wiring device 100 also includes three wire holes 204, which allow the hot wire 132, the neutral wire 134, and the ground wire 136 to be coupled to the electronic components, or contacts, inside the wiring device 100 at one end and remain external to the wiring device 100 at the other end so that they can be electrically coupled to respective building wires.

FIG. 3 is an exploded view of the wiring device 100 including certain internal components, in accordance with an example embodiment of this disclosure. Referring to FIG. 3, the wiring device 100 further includes a daughter printed circuit board ("PCB") 310, a hot terminal 316, a neutral terminal 318, a midframe 320, and a main PCB 330. As illustrated in FIG. 3, the top housing 104 further includes one or more cutouts 302 at one or more respective ends 301 of the top housing 104. The cutouts 302 provide space between the top housing 104 and the main housing 102 for the first and second coupling bands 106, 108 when the top housing 104 is coupled to the main housing 102. The top housing 104 also includes a tab 304 which is configured to be disposed in a notch 338 formed in a corresponding position in the main housing 102, which facilitates proper alignment of the top housing 104 to the main housing 102 when the top housing 104 and main housing 102 are assembled together. The first coupling band 106 is coupled to the second coupling band 108 via the middle portion 306. In certain example embodiments, as illustrated in FIG. 3, the middle portion 306 includes an opening 307 positioned centrally to the middle portion 306. The opening 307 allows certain components in the wiring device 100, such as a USB receptacle, to be disposed therethrough. The daughter PCB 310 includes a first USB receptacle 312 and a second USB receptacle 314. In certain example embodiments, the first and second USB receptacles 312, 314 are disposed through the opening 307 in the middle portion 306 when the wiring device 100 is assembled. The first and second coupling bands 106, 108 are conductively coupled to each other and the middle portion 306. The first and second coupling bands 106, 108 also are electrically coupled to the ground wire 136. Furthermore, the upper coupling band 106 and the middle portion 306 each include a ground terminal slot 308 which receives and conductively couples a ground prong of an AC plug (not shown) to the ground wire 136 when the AC plug is plugged into the first or second AC receptacles 118, 122.

The hot terminal 316 is electrically coupled to the hot wire 132 and the neutral terminal 318 is electrically coupled to the neutral wire 134. The hot terminal 316 is conductively coupled to two hot contacts 317 disposed at opposite ends of the hot terminal 316. The hot contacts 317 each include a spring biased contact mechanism for receiving and electrically coupling to a hot prong of an AC plug (not shown) to be inserted into the first or second AC receptacle 118, 122 of the wiring device 100. Likewise, the neutral terminal 318 is conductively coupled to two neutral contacts 319 disposed at opposite ends of the neutral terminal 318. The neutral contacts 319 each include a spring biased contact mechanism for receiving, gripping, and electrically coupling to a neutral prong of an AC plug (not shown) to be inserted into the first or second AC receptacle 118, 122 of the wiring device. Thus, when an AC plug is inserted, a circuit is completed from the hot wire 316 to the load, and to the neutral wire 318. Accordingly, each of the hot contacts 317 and neutral contacts 319 are aligned with the first and second receptacle 118, 122 of the top housing 104 when the wiring device 100 is assembled.

Figure 6:
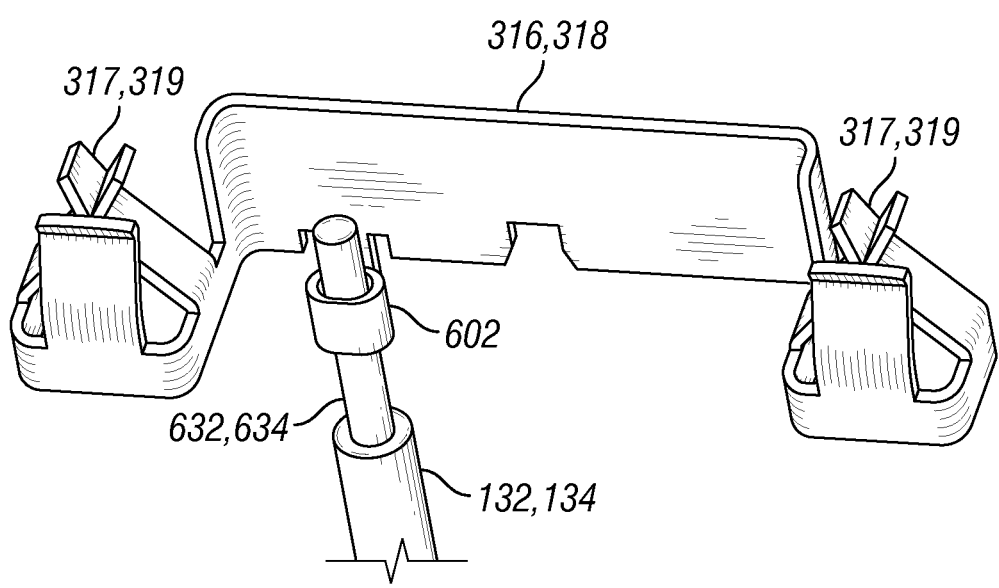
FIG. 6 is a perspective view of a contact terminal of the wiring device with integrated DC output of FIG. 1, in accordance with an example embodiment of the present disclosure.

FIG. 6 is a perspective view of a contact terminal that is representative of both the hot and neutral terminals 316, 318. Referring to FIG. 6, the hot and neutral terminals 316, 318 are substantially identically formed and thus are shown via the same figure for sake of brevity. The hot and neutral terminals 316, 318 are coupled to the hot and neutral wires 132, 134, respectively, via a crimp 602. The crimp 602 is generally clamped around conductive cores 632, 634 of the hot wire 132 and neutral wire 134, respectively. In certain example embodiments, the crimp 602 also is soldered to the hot wire 132 and neutral wire 134, respectively. Thus, the terminals 316, 318 are electrically coupled to the wires 132, 134, respectively, with a high degree of conductivity. The terminals 316, 318 are fabricated from a conductive material such as a copper alloy or any other suitable metal. In certain example embodiments, the terminals 316, 318 are fabricated from a copper alloy including about 90% copper, 8% zinc, and 2% other materials.

Figure 7:
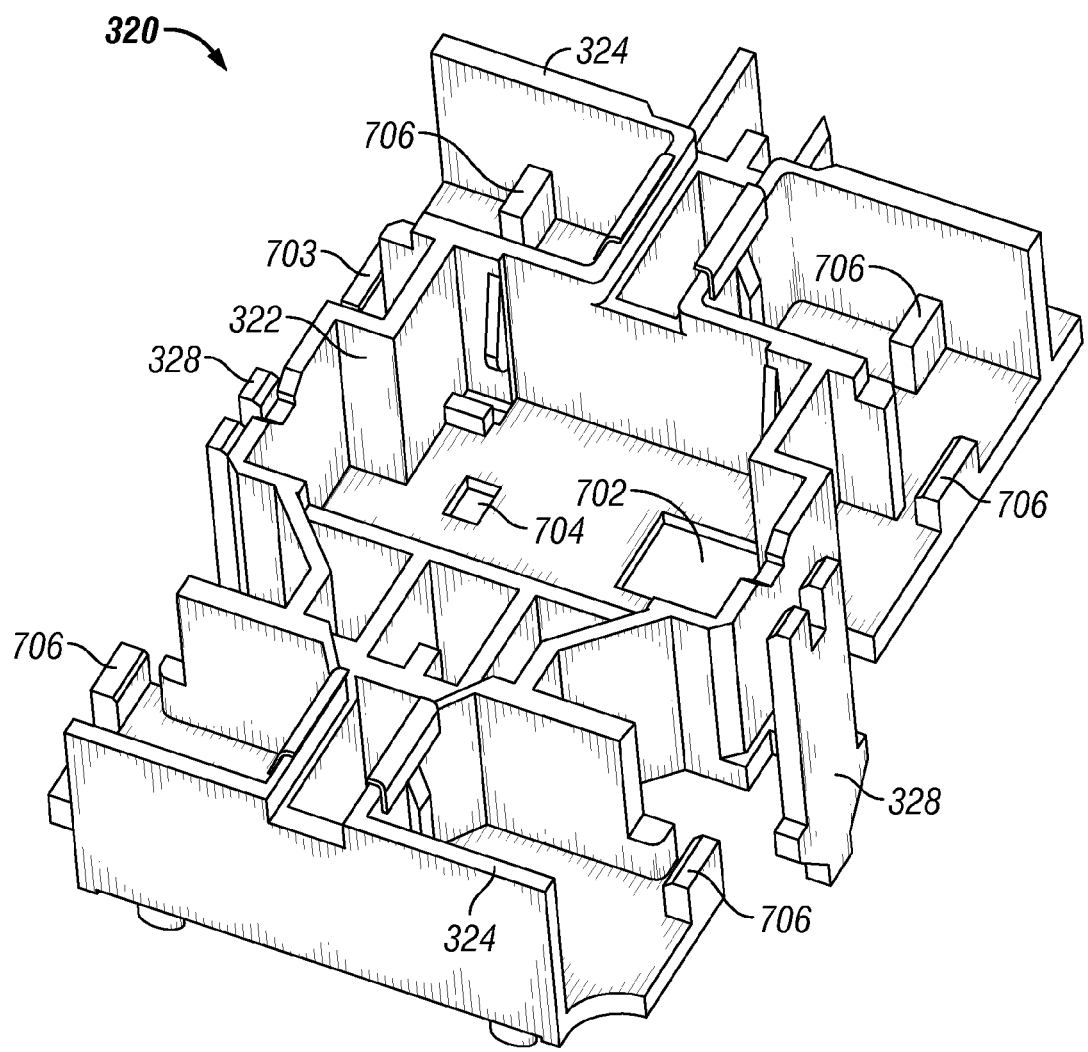
FIG. 7 is a perspective view of a midframe of the wiring device with integrated DC output of FIG. 1, in accordance with an example embodiment of the present disclosure.

Referring to FIG. 3, the midframe 320 is generally disposed over the main PCB 330 and around at least a portion of the daughter PCB 310 when the daughter PCB 310, the main PCB 330 and the midframe 320 are coupled together. Also, portions of the midframe 320 are disposed between the main PCB 330 and the daughter PCB 310 when the daughter PCB 310, the main PCB 330 and the midframe 320 are coupled together. FIG. 7 illustrates a perspective view of the midframe 320, in accordance with an example embodiment. Referring to FIGS. 3 and 7, the midframe 320 includes an inner housing 322 which houses the daughter PCB 310 and first and second USB receptacles 312, 314 when the wiring device 100 is assembled. The midframe 320 also includes a plurality of walls 324 at various positions for keeping the terminals 316, 318 and coupling bands 106, 108 separated and in their respective positions when the wiring device 100 is assembled. Further, the inner housing 322 of the midframe 320 includes a first opening 702, a second opening 703, and a third opening 704 according to certain example embodiments. When the daughter PCB 310 is disposed within the inner housing 322 and coupled to the main PCB 330, which is disposed below the midframe 320 opposite the daughter PCB 310, the openings 702, 703, 704 allow electrical connections to be made between the daughter PCB 310 and the main PCB 330 by one or more electronic components, wires, headers, or the like which traverse the openings 702, 703, 704. The midframe 320 further includes a plurality of ledges 706. The ledges 706, in conjunction with the walls 324, keep the terminals 316, 318 in place when the wiring device 100 is installed.

Referring to FIG. 3, the main PCB 330 includes a plurality of electronic components and elements disposed thereon for effectively converting received AC power into appropriately rated DC power to be outputted at the first and second USB receptacles 312, 314. As the main PCB 330, which includes high voltage electrical components, generates a large amount of heat according to certain example embodiments, the midframe 320 acts as a thermal barrier between the hot main PCB 330 and the daughter PCB 310. The midframe 320 thereby prevents the daughter PCB 310 from becoming overheated. The midframe 320 includes one or more side clips 328 which clip onto one or more sides of the main PCB 330, thereby holding the main PCB 330 adjacent to the midframe 320. In certain example embodiments, the midframe 320 is fabricated from a polycarbonate grade capable of withstanding the high temperatures generated by the high voltage components of the main PCB 330. In certain example embodiments, the midframe 320 is fabricated from a glass-filled nylon. In certain example embodiments, the main PCB 330 includes areas of copper plates disposed thereon for increased heat dissipation. Additionally, the main PCB 330 is fabricated from a 2 ounce ("oz.") copper board for further increased heat dissipation. Both of these features contribute to an overall increased efficiency.

The main housing 102 includes holes 336 where screws 114 are threaded therethrough when assembled. The screws 114 also are partially threaded into the top housing 104, thereby coupling the main housing 102 to the top housing 104. Generally, the main PCB 330, the midframe 320, the hot terminal 316, the neutral terminal 318, and the daughter PCB 310 are disposed inside the main housing 102 when the wiring device 100 is assembled.

Figure 4:
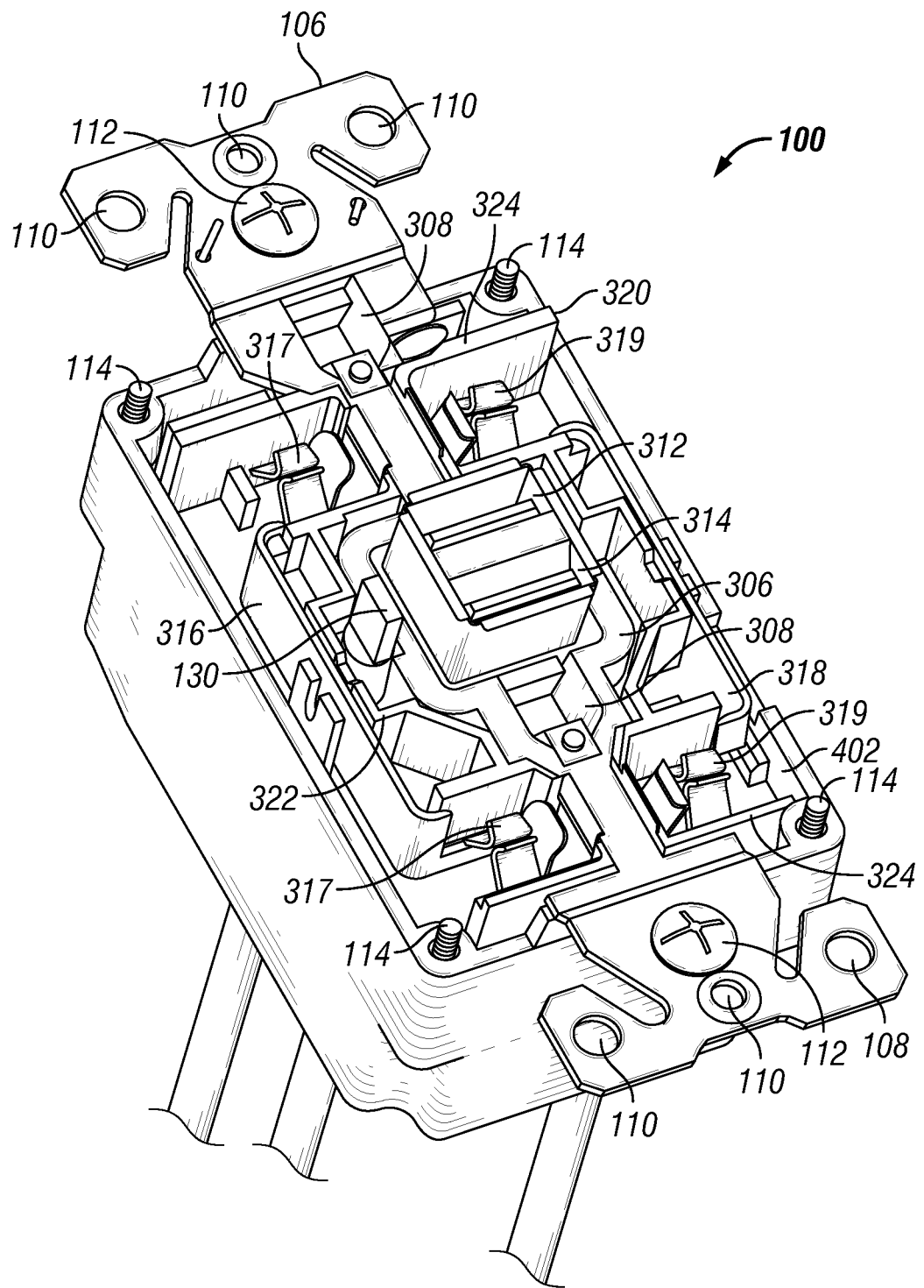
FIG. 4 is a perspective view of a partially disassembled wiring device with integrated DC output of FIG. 1 with a top housing removed, in accordance with an example embodiment of the present disclosure.

FIG. 4 is a perspective internal view of a partially assembled wiring device 100. Referring to FIG. 4, all the parts of the wiring device 100 are in their respective assembled positions with the exception of the top housing 104 (FIG. 1), which has been removed to show the internal view. The main housing 102 includes a cavity 402 formed therein for receiving the internal components of the wiring device 100. The cavity 402 is substantially rectangular, although the cavity 402 has a different shape in other example embodiments. The midframe 320 is similarly rectangular shaped as the cavity 402 and generally fits within the cavity 402 such that it essentially does not move with respect to the main housing 102. The inner housing 322 and walls 324 of the midframe 320 separate the hot terminal 316 and the neutral terminal 318 as well as the USB receptacles 312, 314. The upper coupling band 106, lower coupling band 108, and the middle portion 306 are partially disposed lengthwise and centrally within the midframe 320. Specifically, the middle portion 306 is disposed around the first and second USB receptacles 312, 314 and within the inner housing 322 of the midframe 320 where it is separated from both the hot terminal 316 and the neutral terminal 318. The indicator light 130 is generally coupled to the daughter PCB 310. According to some example embodiments, the indicator light 130 is a light emitting diode ("LED"); however, the indicator light 130 is a different light source type in other example embodiments. Although one example embodiment has been provided and described with respect to the midframe 320, the midframe 320 is fabricated in different configurations in other example embodiments.

Figure 5:
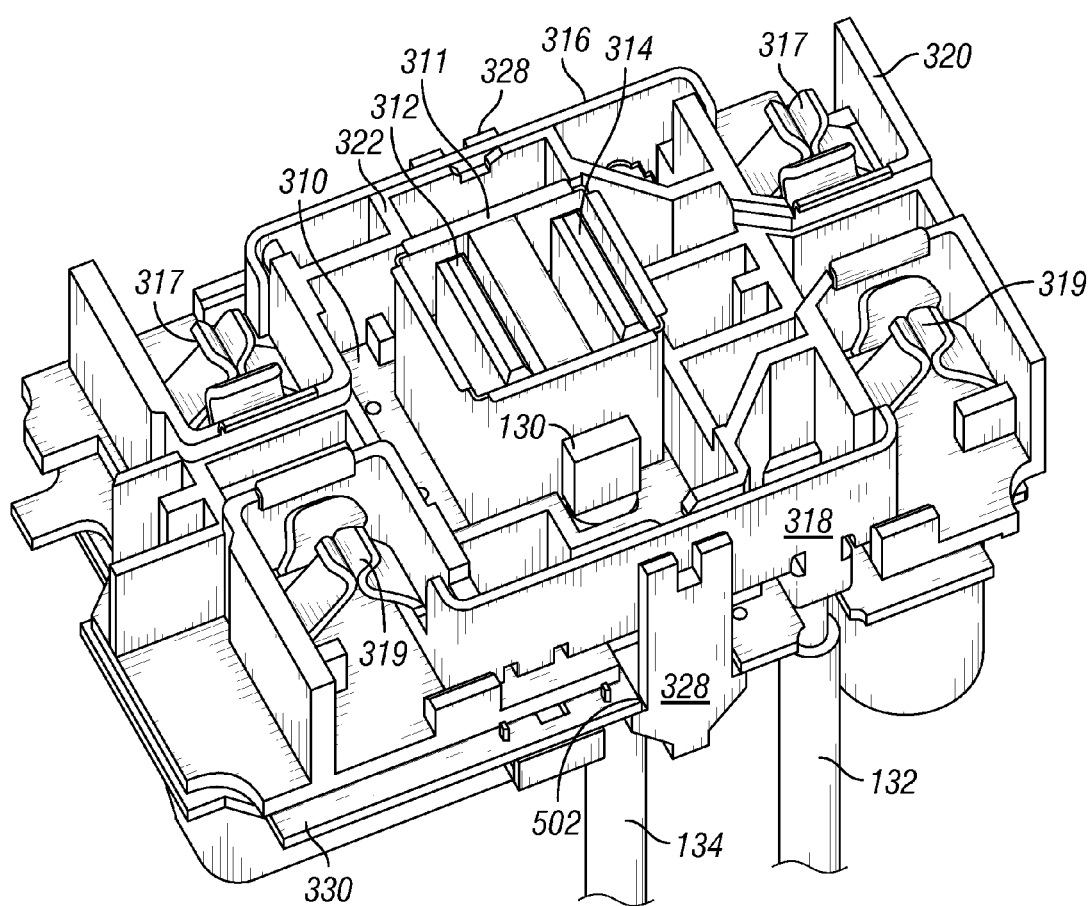
FIG. 5 is a perspective view of a partially disassembled wiring device with integrated DC output of FIG. 1 with a top housing, a main housing, and a coupling band removed, in accordance with an example embodiment of the present disclosure.

FIG. 5 is a perspective view of a further disassembled wiring device 100 in which the top housing 104, the main housing 102, and the coupling bands 106, 108 have been removed, in accordance with an example. Referring to FIG. 5, the midframe 320 is disposed above the main PCB 330 and in between the daughter PCB 310 and the main PCB 330. Further, the midframe 320 is mechanically fastened to the main PCB 330 via a pair of side spring clips 328 that latch onto notches 502 formed on opposing sides of the main PCB 330.

Figure 8:
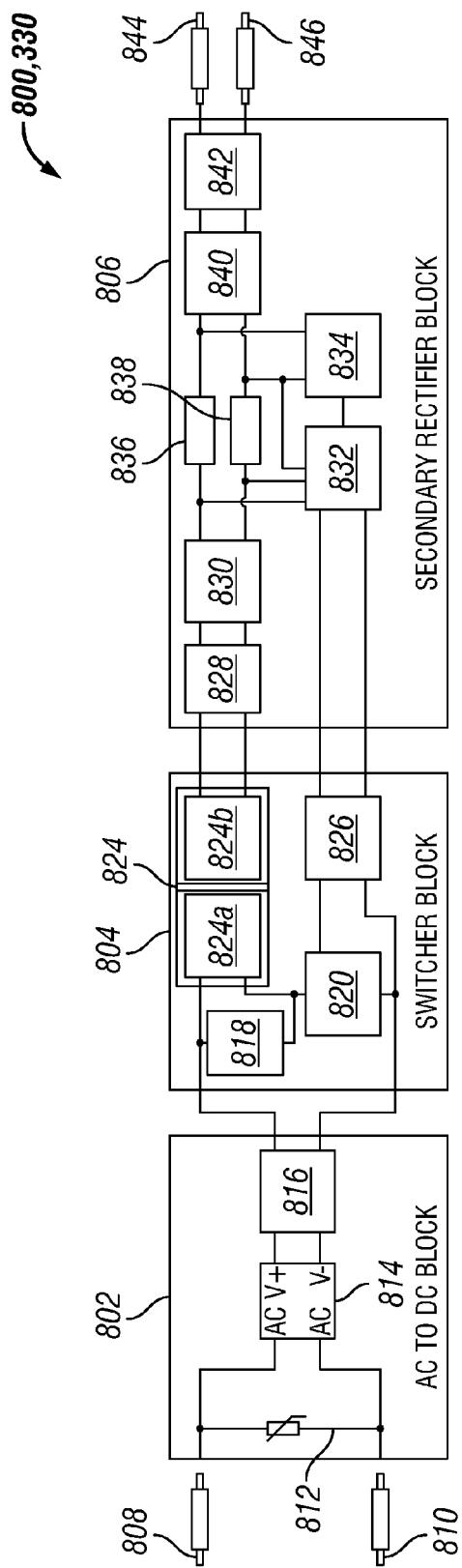
FIG. 8 is a block diagram of an electronic circuitry of a main PCB of a wiring device with integrated DC output, in accordance with an example embodiment of the present disclosure.
Figure 10:
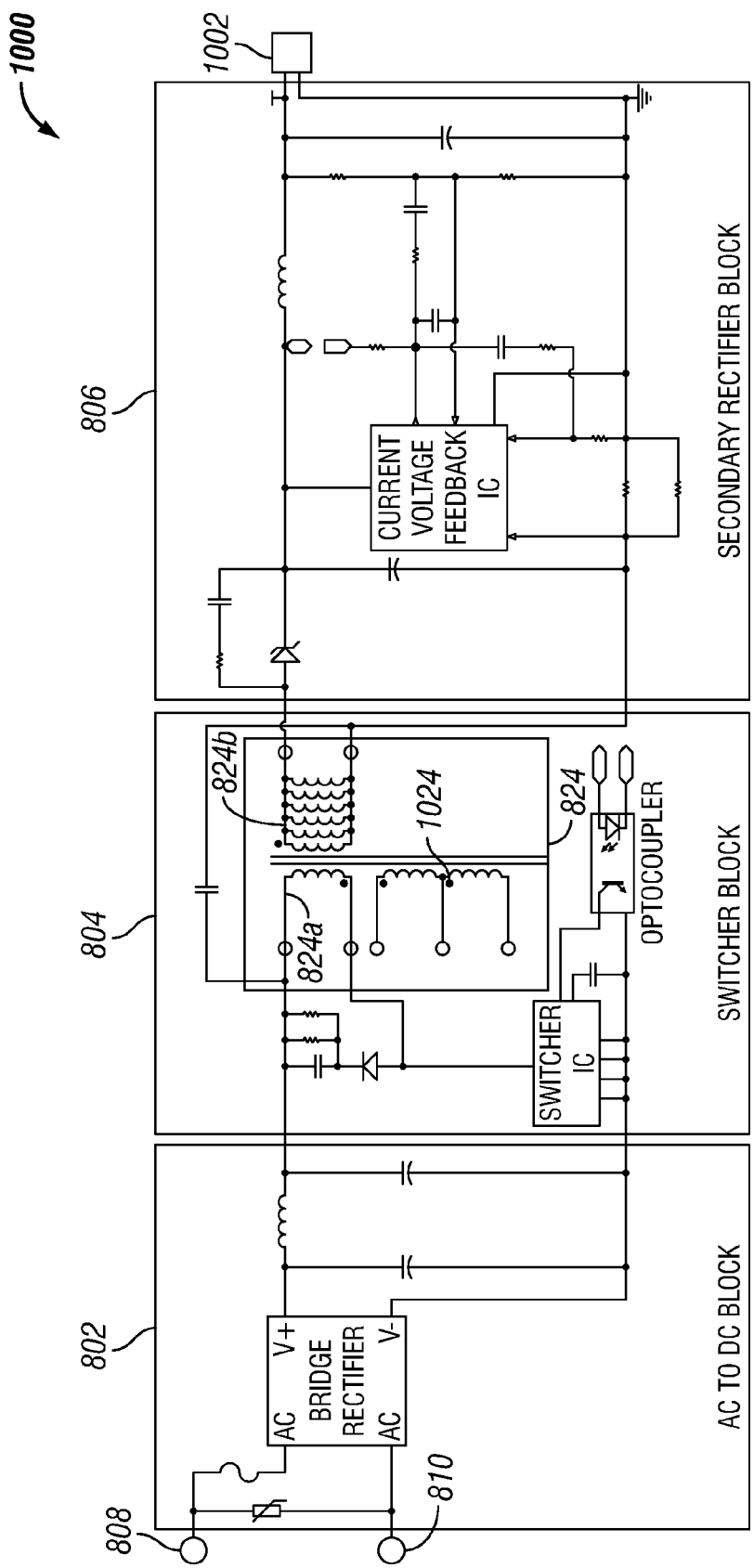
FIG. 10 is a schematic diagram of a main circuit of the wiring device with integrated DC output, in accordance with an example embodiment of the present disclosure.

FIG. 8 is a block diagram representation of an electronic circuit of the main PCB 330, in accordance with an example embodiment. FIG. 10 is a schematic representation of an example embodiment of the block diagram of FIG. 8, in accordance with an example embodiment. Specifically, FIG. 10 illustrates a specific example configuration of an electrical circuit and example components used to implement functional aspects of the block diagram of FIG. 8. Although one depiction has been provided of the configuration of the electrical circuit used, other configurations of the electrical circuit is used in different example embodiments. Referring to FIGS. 8 and 10, a main PCB 800 includes an AC/DC conversion block 802, a switcher block 804, and a secondary rectifier block 806. The AC/DC conversion block 802 is coupled to a hot terminal 808 and a neutral terminal 810, which are electrically coupled to the hot and neutral wires 132, 134 (FIG. 1) respectively. Referring to FIG. 8, in certain example embodiments, the AC/DC conversion block 802 includes a surge suppressor 812, a bridge rectifier 814, and a DC filter 816. As illustrated, the surge suppressor 812 is coupled between the bridge rectifier 814 and the hot and neutral wires 132, 134, and extends between the hot wire 132 and the neutral wire 134. The surge suppressor 812 protects the circuit from voltage surges that could potentially harm the circuit. The bridge rectifier 814 converts the received AC power into high voltage DC power of, for example, 170 V. The DC filter 816 receives the DC power from the bridge rectifier 814 and smoothes the DC voltage into a steady voltage. FIG. 10 illustrates one possible implementation of the AC/DC conversion block 802. Referring to FIG. 8, the DC filter 816 of the AC/DC conversion block 802 is coupled to the switcher block 804.

The switcher block 804 converts the high voltage DC power into an isolated low voltage DC output. In certain example embodiments, the switcher block 804 converts the high voltage DC power into a 5 V DC output compatible with USB standards. The switcher block 804 includes a snubber circuit 818, a switcher IC 820, a transformer 824, and a current voltage feedback optocoupler 826. The switcher IC 820 functions as a power supply controller. In certain example embodiments, the switch IC 820 includes a field effect transistor ("FET") having a relatively low on-resistance, which allows for higher efficiency. This contributes to enhanced power management. The snubber circuit 818 reduces or eliminates high voltage spikes that are potentially damaging to the circuit. The transformer 824 steps down the received DC voltage into a USB compatible low voltage DC output (e.g., 5 V). The transformer 824 includes a primary side 824a and a secondary side 824b according to some example embodiments. Referring to FIG. 10, according to certain example embodiments, the windings on secondary side 824b of the transformer 824 is made of litz wire, which includes many (e.g., 120) strands of thin wire twisted or woven together to form the winding. The litz wire generally performs better at high frequencies and has lower resistance, which further enhances power efficiency of the circuit. The transformer 824 further includes one or more shielding windings 1024, which reduce or suppress certain interference signals such as electromagnetic interference. The current voltage feedback optocoupler 826 is coupled to the switcher IC 820 and receives feedback from the secondary rectifier block 806 such that the switcher IC 820 appropriately controls or shuts down the power supply if excessive current is being drawn. The optocoupler 826 allows the low voltage side of the circuit (downstream of the transformer 824) and the high voltage side of the circuit (upstream of the transformer 824) to communicate while preventing the high voltage from damaging or distorting low voltage components and outputs. FIG. 10 illustrates one possible implementation of the switcher block 804.

Referring to FIG. 8, the secondary rectifier block 806 includes a rectifier diode 828, a first DC filter 830, a RF choke 836, a current shunt 838, a current voltage feedback IC 832, voltage feedback components 834, a second DC filter 840, and a DC connector 842. The rectifier diode 828, which receives the 5V output from the switcher block 804, the first DC filter 830, the RF choke 836, the current shunt 838, and the second DC filter 840 work to further rectify, smooth, filter, or otherwise condition the 5V output to be clean and consistent for use by a DC load. The conditioned DC output is then received by the DC connector 842. The DC connector 842 is further coupled to a hot wire 844 and a neutral wire 846 for delivering the output to the daughter PCB 310. In certain example embodiments, the hot wire 844 and the neutral wire 846 are included in a header style connector. The voltage feedback components 834 and current voltage feedback IC 832 monitor the voltage and current conditions of the DC output and provide feedback to the current voltage feedback optocoupler 826 via a single feedback. Thus, the switcher IC 820 controls the power supply accordingly.

Figure 9:
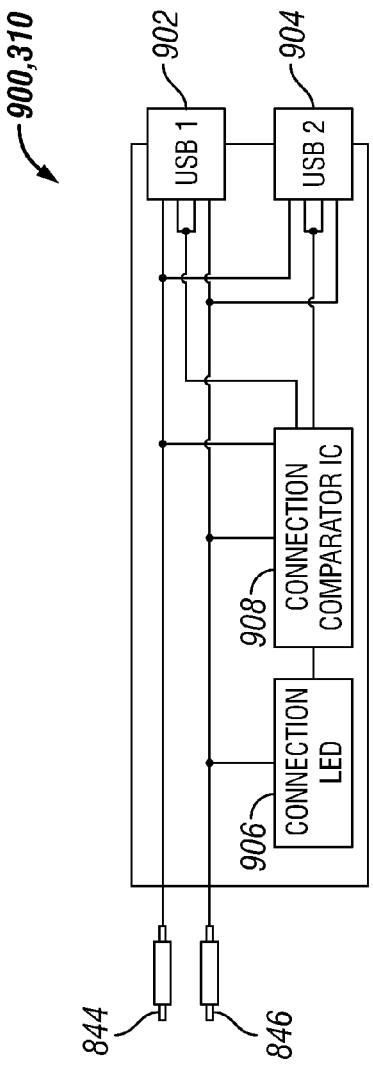
FIG. 9 is a block diagram of an electronic circuitry of a daughter PCB of a wiring device with integrated DC output, in accordance with an example embodiment of the present disclosure.
Figure 11:
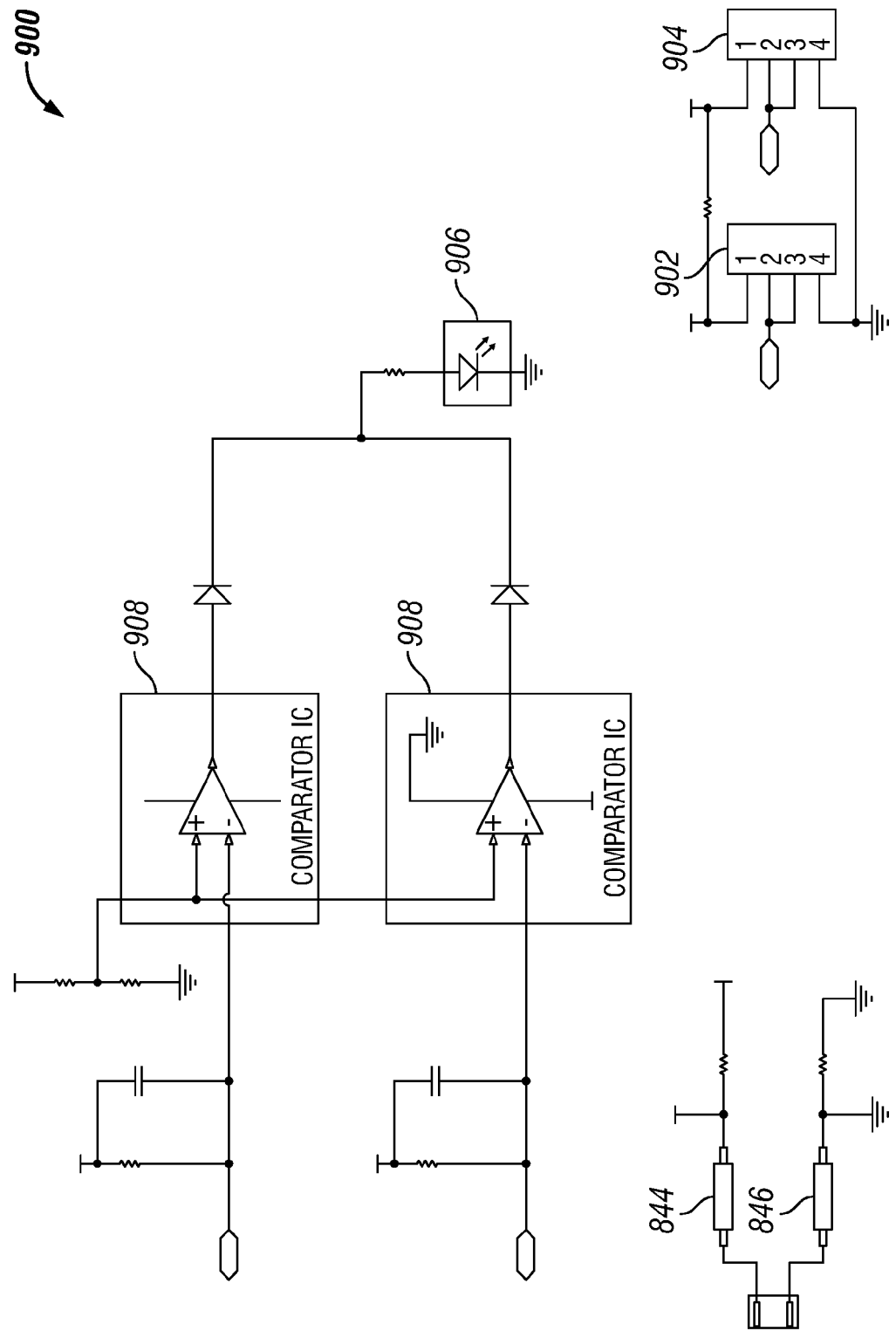
FIG. 11 is a schematic diagram of a daughter circuit of the wiring device with integrated DC output, in accordance with an example embodiment of the present disclosure.

FIG. 9 is a block diagram representation of the daughter PCB 310, in accordance with an example embodiment. Referring to FIG. 9, a daughter PCB block diagram 900 includes a first USB jack 902, a second USB jack 904, a connection LED 906, and one or more connection comparator ICs 908. The daughter PCB 310 is electrically coupled to the main PCB 330 (FIG. 8) via the hot wire 844 and the neutral wire 846. Thus, processed DC power is provided from the main PCB 330 (FIG. 8) to the daughter PCB 310, where it is outputted via the first and second USB jacks 902, 904. Additionally, the connection comparator IC 908 determines when a USB is plugged into at least one of the first and/or second USB jacks 902, 904, thereby completing the circuit. When a USB connection is detected, the connection comparator IC 908 powers the connection LED 906, which indicates that a USB connection is made. FIG. 11 is a schematic diagram illustrating one specific example electrical implementation of the daughter PCB 900, including the comparators 908, connection LED 906, the USB jacks 902, 904, and the hot wire 844 and neutral wire 846 connections from the main PCB 800 (FIG. 8).

Although each example embodiment has been described in detail, it is to be construed that any features and modifications that are applicable to one embodiment are also applicable to the other embodiments. Furthermore, although the disclosure has been described with reference to specific embodiments, these descriptions are not meant to be construed in a limiting sense. Various modifications of the disclosed embodiments, as well as alternative embodiments of the disclosure will become apparent to persons of ordinary skill in the art upon reference to the description of the example embodiments. It should be appreciated by those of ordinary skill in the art that the conception and the specific embodiments disclosed may be readily utilized as a basis for modifying or designing other structures or methods for carrying out the same purposes of the disclosure. It should also be realized by those of ordinary skill in the art that such equivalent constructions do not depart from the spirit and scope of the disclosure as set forth in the appended claims. It is therefore, contemplated that the claims will cover any such modifications or embodiments that fall within the scope of the disclosure.

What is claimed is:

1. A wiring device with DC output, comprising:
a housing comprising an AC opening and a DC opening;
an AC power output interface disposed within the housing and aligned with the AC opening, wherein the AC power output interface is electrically coupled to a wire receiver, wherein the wire receiver receives and electrically couples with electrical wires that provide AC power to the AC power output interface when the wiring device is coupled to a power supply of a building,
wherein the wire receiver comprises a pair of coupling bands electrically coupled to a ground wire, and wherein the pair of coupling bands include: an upper coupling band, a lower coupling band, and a middle portion that includes an opening that is positioned central to the middle portion, the middle portion conductively couples the upper coupling band to the lower coupling band;
a first printed circuit board (PCB) disposed within the housing and electrically coupled to one or more of the electrical wires, and wherein the first PCB receives the AC power from the electrical wires and converts the AC power into DC power when the wiring device is coupled to the power supply of the building; and
a DC power output interface disposed within the housing and through the opening in the middle portion of the coupling bands such that the middle portion surrounds the DC power output interface, wherein the DC power output interface is aligned with the DC opening, and wherein the DC power output interface is electrically coupled to the first PCB and receives the DC power from the first PCB.

2. The wiring device with DC output of claim 1, comprising:
a second PCB disposed within the housing, wherein the second PCB is electrically coupled to the first PCB and the DC power output interface, and wherein the second PCB receives the DC power from the first PCB and outputs the DC power via the DC power output interface.

3. The wiring device with DC output of claim 1, comprising: a midframe disposed within the housing substantially between the first PCB and the second PCB, wherein the midframe at least partially insulates the second PCB and the DC power output interface from heat generated at the first PCB.

4. The wiring device with DC output of claim 1, wherein the first PCB comprises an AC/DC conversion element, a switcher element, and a secondary rectifier element.

5. The wiring device with DC output of claim 1, wherein the DC power output interface comprises a universal serial bus receptacle (USB).

6. The wiring device with DC output of claim 4, wherein the switcher element comprises a transformer, the transformer comprising a secondary winding constructed of litz wire.

7. The wiring device with DC output of claim 1, wherein the housing comprises a back side, and wherein the back side of the housing comprises one or more first apertures adapted to receive fasteners that couple the bottom side to a top side of the housing, one or more second apertures for receiving the electrical wires, and one or more third openings for dissipating heat.

8. The wiring device with DC output of claim 1, wherein the first PCB comprises a single feedback between a voltage sensor and/or current sensor and a power supply controller.

9. A wiring device with AC and DC output, comprising:
a housing comprising
a top portion that comprises an AC opening and a DC opening;
a bottom portion coupled to the top side; and
a midframe disposed between the top portion and the bottom portion;
a first printed circuit board (PCB) disposed on a first side of the midframe that faces the bottom portion of the housing such that the first PCB is positioned between the first side of the midframe and the bottom portion of the housing, wherein the first PCB receives AC power and converts the AC power into a DC power when the wiring device is coupled to a power supply of a building;
an upper coupling band and a lower coupling band that are conductively coupled to each other by a middle portion that includes an opening positioned central to the middle portion,
wherein the middle portion is disposed within the midframe on a second side of the midframe that faces the top portion of the housing while the upper coupling band and the lower coupling band are positioned outside the housing;
a second PCB disposed within the midframe on the second side of the midframe and electrically coupled to and receiving the DC power from the first PCB; and
a DC power output interface disposed on the second PCB and through the opening of the middle portion such that the middle portion surrounds the DC power output interface, wherein the DC power output interface is aligned with the DC opening, and wherein the DC power output interface receives the DC power from the second PCB.

10. The wiring device with AC and DC output of claim 9, wherein the midframe is disposed within the housing at least partially between the first PCB and the second PCB, wherein the midframe at least partially insulates the second PCB and DC power output interface from heat generated at the first PCB.

11. The wiring device with AC and DC output of claim 9, further comprising: a first terminal coupled to a hot wire via a crimp, solder, or crimp and solder; and a second terminal coupled to a neutral wire via the crimp, solder, or crimp and solder.

12. The wiring device with AC and DC output of claim 9, wherein the AC opening is configured to receive an output AC power having at least a 120 volt, 15 amp rating, and the DC power output interface is configured to output DC power having at least a 5 volt, 1.8 amp rating.

13. The wiring device with AC and DC output of claim 9, wherein the DC power output interface comprises a universal serial bus (USB) receptacle.

14. The wiring device with AC and DC output of claim 10, wherein the midframe is at least partially fabricated from a polycarbonate material, a glass-filled nylon, or both.

15. The wiring device with AC and DC output of claim 9, wherein the first PCB is fabricated from a two ounce copper board.

16. A wiring device with AC and DC output, comprising:
a housing comprising an AC opening and a DC opening;
an AC power output interface disposed within the housing and aligned with the AC opening, wherein the AC power output interface comprises a wire receiving portion, wherein the wire receiving portion is crimped, soldered, or crimped and soldered to receive electrical wires that provide AC power to the AC power output interface when the wiring device is coupled to a power supply of a building,
wherein the wire receiving portion comprises a pair of coupling bands, and
wherein the pair of coupling bands include an upper coupling band, a lower coupling band, and a middle portion that includes an opening positioned central to the middle portion, the middle portion conductively couples the upper coupling band to the lower coupling band;
a first printed circuit board (PCB) electrically coupled to the one or more of the electrical wires and receives the AC power from the electrical wires and converts the AC power into a DC power when the wiring device is coupled to the power supply of the building;
a second PCB electrically coupled to and receives the DC power from the first PCB when the wiring device is coupled to the power supply of the building; and
a DC power output interface disposed on the second PCB and aligned with the DC opening, wherein the DC power output interface receives the DC power from the second PCB,
wherein the middle portion of the pair of coupling bands is disposed around the DC power output interface such that the DC power output interface passes through the opening of the middle portion within the housing.

17. The wiring device with AC and DC output of claim 16, further comprising: a midframe disposed within the housing at least partially between the first PCB and the second PCB, wherein the midframe at least partially insulates the second PCB and DC power output interface from heat generated at the first PCB.

18. The wiring device with AC and DC output of claim 16, wherein the AC power output interface comprises an electrical plug receptacle.

19. The wiring device with AC and DC output of claim 16, wherein the first PCB comprises a voltage sensor and/or a current sensor, a power supply controller, and a single feedback between the voltage sensor and/or current sensor and the power supply controller.

20. The wiring device with AC and DC output of claim 16, wherein the first PCB comprises a transformer, the transformer comprising a secondary winding constructed of litz wire.

\* \* \* \* \*